(12) United States Patent
Suzuki

(10) Patent No.: US 12,739,996 B2
(45) Date of Patent: Sep. 15, 2026

(54) CASING OF ELECTRICAL DEVICE

(71) Applicant: TOYOTA JIDOSHA KABUSHIKI KAISHA, Toyota (JP)

(72) Inventor: Toshio Suzuki, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 50 days.

(21) Appl. No.: 18/948,901

(22) Filed: Nov. 15, 2024

(65) Prior Publication Data

US 2025/0220839 A1 Jul. 3, 2025

(30) Foreign Application Priority Data

Dec. 28, 2023 (JP) ................................ 2023-222367

(51) Int. Cl.
*H05K 5/06* (2006.01)

(52) U.S. Cl.
CPC .................................. *H05K 5/061* (2013.01)

(58) Field of Classification Search
CPC ......... H05K 5/03; H05K 5/061; H05K 5/0217
USPC ........................................... 312/223.1, 223.2
See application file for complete search history.

(56) References Cited

U.S. PATENT DOCUMENTS 8,625,293 B2 * 1/2014 Snider ................ H05K 7/20436 252/512
2019/0147917 A1 * 5/2019 Yap .................... G11B 23/0326 312/223.2
2021/0251094 A1 * 8/2021 Okamoto ............. H05K 5/0056

FOREIGN PATENT DOCUMENTS

JP 2005-327991 A 11/2005
JP 2020-078971 A 5/2020

* cited by examiner

*Primary Examiner* — James O Hansen
(74) *Attorney, Agent, or Firm* — SoraIP, Inc.

(57) ABSTRACT

The casing disclosed by the specification includes a housing and a cover that have conductivity, and a gasket that has non-conductivity. The housing has an opening around which a first seat surface is provided. The cover blocks the opening of the housing. The gasket is disposed between the first seat surface and the cover. The gasket is a liquid gasket that is initially flowable but hardens after application. The housing is provided with a second seat surface, a positioning pin protruding from the second seat surface, and a groove separating the second seat surface from the first seat surface. The cover has a tab extending from the cover main body along the second seat surface. A positioning hole fitting into the positioning pin is provided on the tab. The tab is in contact with the second seat surface, and the cover and the housing are electrically connected via the tab.

4 Claims, 3 Drawing Sheets

CASING OF ELECTRICAL DEVICE

CROSS-REFERENCE TO RELATED APPLICATION

This application claims priority to Japanese Patent Application No. 2023-222367 filed on Dec. 28, 2023, incorporated herein by reference in its entirety.

BACKGROUND

1. Technical Field

The technology disclosed by the present specification relates to a casing of an electrical device.

2. Description of Related Art

A housing of a casing of an electrical device includes an opening for a user to access an electrical component inside. Normally, the opening is closed by a cover. A gasket is disposed between the surroundings of the opening and the cover to seal between an edge of the opening and the cover. Japanese Unexamined Patent Application Publication No. 2005-327991 (JP 2005-327991 A) and Japanese Unexamined Patent Application Publication No. 2020-078971 (JP 2020-078971 A) disclose an inverter in which a gasket is disposed between an opening and a cover. An inverter is one type of an electrical device.

SUMMARY

While the housing and the cover are made of a conductive material, the gasket is often made of a non-conductive material. The housing is often used as an electrical ground (earth) of an electrical component inside. If the housing and the cover are not conducting electricity, there is a risk that a potential difference occurs between the housing and the cover. The potential difference between the housing and the cover can cause electromagnetic noise to be emitted through the casing (or electromagnetic noise to enter the casing).

Normally, the cover is fixed to the housing with a bolt. If the cover and the housing make contact in the surroundings of the bolt, both the cover and the housing will conduct electricity. On the other hand, a liquid gasket may be used for sealing between the cover and the housing. A liquid gasket is a sealing material that has fluidity in an initial state, and after being applied to the surroundings of the housing, hardens by drying, ultraviolet rays, heat or the like. If a liquid gasket is used, there is a risk that the liquid gasket spreads to the surroundings of the bolt while having fluidity, and electrical conduction between the cover and the housing is impaired at the surroundings of the bolt. The present specification provides technology in which a housing and a cover surely conduct electricity, in a casing (casing of an electrical device) in which a liquid gasket is used for sealing between the housing and the cover.

The casing disclosed by the present specification includes a housing and a cover that have conductivity, and a gasket that has non-conductivity.

The housing has an opening, and a first seat surface is provided in the surroundings of the opening. The cover closes the opening of the housing.

The gasket is disposed between the first seat surface and the cover.

A second seat surface positioned adjacent to the first seat surface, a positioning pin that protrudes from the second seat surface, and a groove that separates the second seat surface from the first seat surface are provided in the housing.

The cover has a cover main body and a tab. The tab extends from the cover main body along the second seat surface. A positioning hole that fits into the positioning pin is provided on the tab.

The gasket is a liquid gasket that has fluidity before being applied to the first seat surface and hardens after being applied to the first seat surface.

The tab makes contact with the second seat surface, and the cover and the housing are electrically conductive via the tab.

In the casing disclosed by the present specification, the cover is electrically conductive with the housing via the tab that makes contact with the second seat surface. The second seat surface is separated from the first seat surface by the groove. Even if the liquid gasket applied to the first seat surface spreads to the surroundings of the first seat surface, since an excess gasket falls into the groove, the excess gasket does not reach the second seat surface. Namely, the excess gasket does not interfere with electrical conduction between the tab and the housing. Namely, the cover is surely electrically conductive with the housing.

The height of the second seat surface may be equal to or greater than the surface height of the gasket. When the cover is attached to the housing, the tab and the second seat surface surely make contact.

Details of the technique disclosed in the present specification and further modifications will be described in the "DETAILED DESCRIPTION OF EMBODIMENTS" below.

BRIEF DESCRIPTION OF THE DRAWINGS

Features, advantages, and technical and industrial significance of exemplary embodiments of the disclosure will be described below with reference to the accompanying drawings, in which like signs denote like elements, and wherein.

DETAILED DESCRIPTION OF EMBODIMENTS

Figure 1:
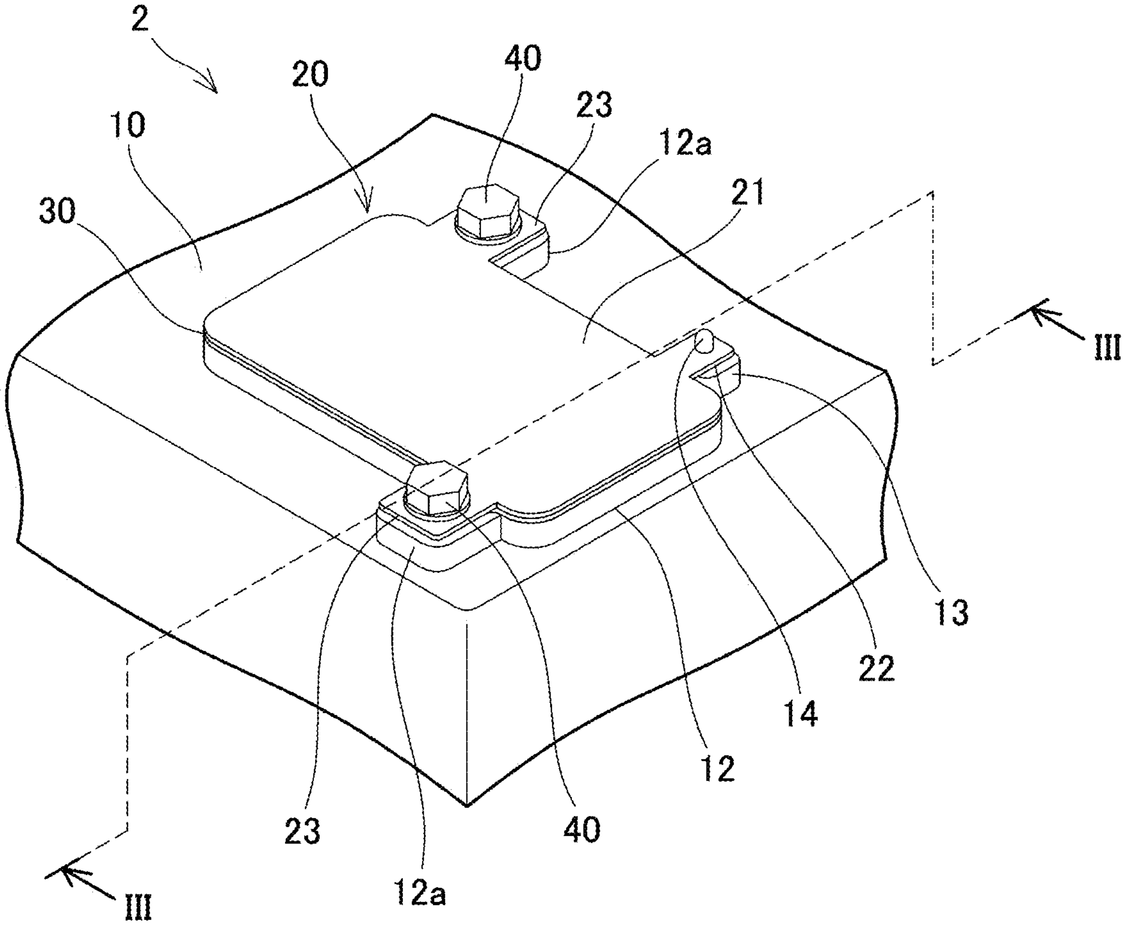
FIG. 1 is a perspective view of a casing of an embodiment.
Figure 2:
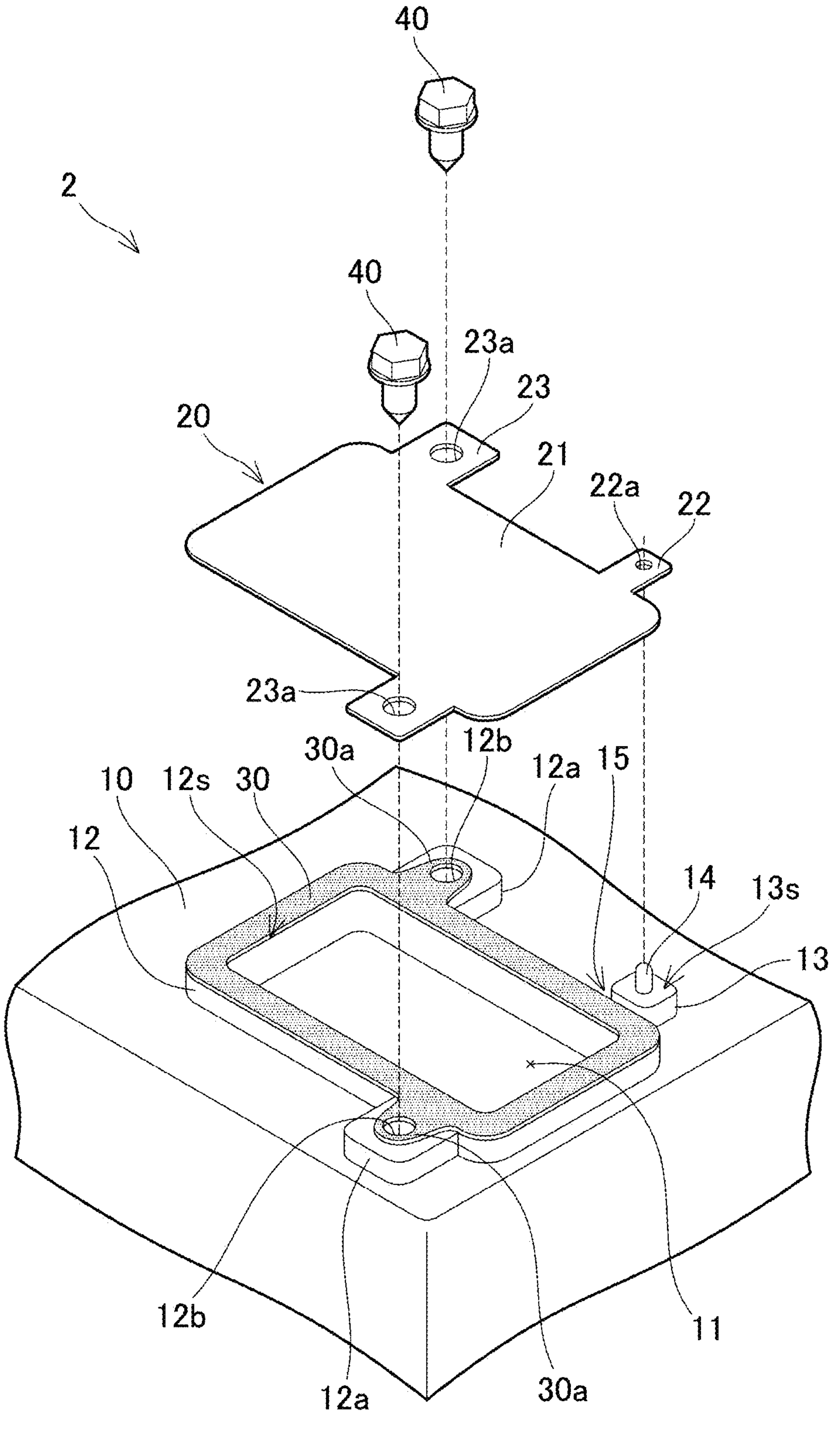
FIG. 2 is a perspective view of the casing of the embodiment (covered removed state)
Figure 3:
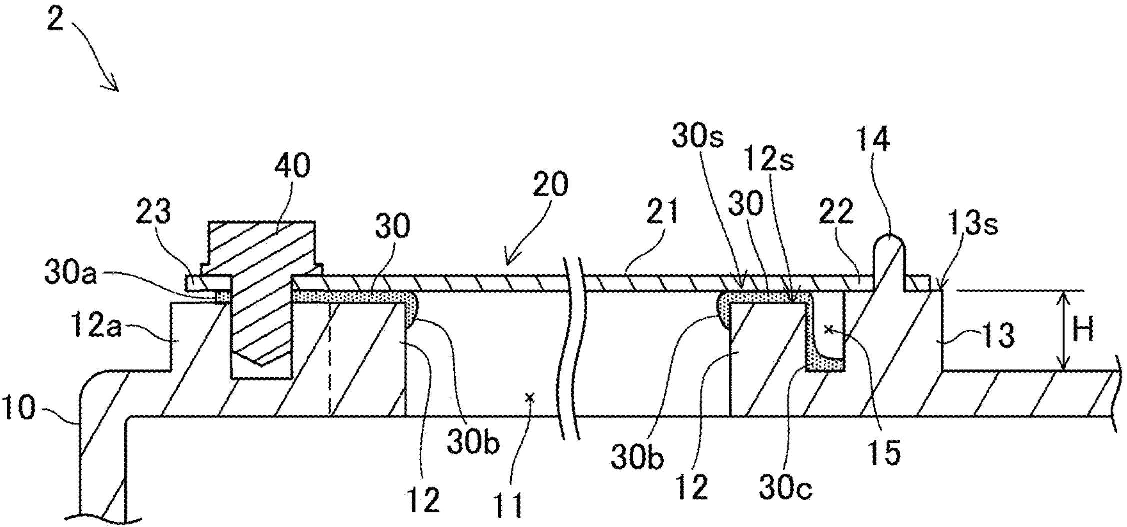
FIG. 3 is a cross-sectional view of the casing taken along III-III of FIG. 1.

The casing 2 of the embodiment will be described with reference to the drawings. FIG. 1 shows a perspective view of the casing 2. FIG. 2 is a perspective view of the casing 2 with the cover 20 removed. FIG. 3 shows a cross-sectional view of the casing 2 along III-III of FIG. 1. In FIGS. 1 to 3, only a portion of the casing 2 is shown. Electrical components are housed inside the casing 2. The casing 2 is a housing of an electrical device, and specifically, for example, a casing of an inverter.

The main components of the casing 2 are a housing 10 for accommodating electrical components and a cover 20. An opening 11 is provided in one surface of the housing 10. The opening 11 is provided for the maintenance staff to check the state of the internal electrical components and to replace the electrical components. The opening 11 for maintenance may be referred to as an access hole.

The cover 20 closes the opening 11. The cover 20 is secured to the housing 10 with bolts 40. The area occupied by the opening 11 is a part of one surface of the housing 10, and the housing 10 is provided with a cover base 12 so as to surround the opening 11. The cover 20 is attached to the cover base 12. The cover base 12 is provided with two fixing-base 12*a* protruding laterally, and bolt hole 12*b* are provided on the top surface of each fixing-base 12*a*.

The cover 20 is made of a single metal plate. The cover 20 includes a cover main body 21 that closes the opening 11, and a fixing tab 23 and a positioning tab 22 that extend from an edge of the cover main body 21. The fixing tabs 23 extend along the top surface of the fixing base 12*a*. The fixing tab 23 is provided with a bolt hole 23*a* through which the bolt 40 passes. The bolt 40 passes through the bolt hole 23*a* of the fixing tab 23 and is fixed to the bolt hole 12*b* of the fixing base 12*a*. The top surface of the cover base 12 is hereinafter referred to as the first seat surface 12*s*.

The housing 10 is provided with a pin base 13 adjacent to the cover base 12. The cover base 12 and the pin base 13 are both provided on one surface of the housing 10. The top surface of the pin-base 13 is referred to as a second seat surface 13*s*. The second seat surface 13*s* is provided with a positioning pin 14. The positioning pin 14 protrudes from the second seat surface 13*s*.

A groove 15 is provided between the cover base 12 and the pin base 13. In other words, a groove 15 is provided between the first seat surface 12*s* and the second seat surface 13*s*. The groove 15 separates the second seat surface 13*s* from the first seat surface 12*s*.

The positioning tabs 22 extend from the edge of the cover main body 21 along the second seat surface 13*s*. In other words, the positioning tabs 22 face the second seat surface 13*s*. The positioning tab 22 is provided with a positioning hole 22*a* to be fitted to the positioning pin 14.

When the cover 20 is attached to the housing 10, the positioning hole 22*a* is passed through the positioning pin 14 to determine an appropriate position of the cover 20 relative to the cover base 12. The housing 10 includes a plurality of positioning pins, and the cover 20 includes a plurality of positioning tabs corresponding to the respective positioning pins. However, only one positioning pin 14 and one positioning tab 22 are shown in the figure, and the other positioning pins and positioning tabs are not shown.

A gasket 30 is sandwiched between the first seat surface 12*s* and the cover main body 21. In FIG. 2, the surface of the gasket 30 is hatched in gray to aid understanding. The gasket 30 seals between the first seat surface 12*s* and the cover 20. In other words, the gasket 30 seals around the opening 11. The gasket 30 is flowable prior to being applied to the first seat surface 12*s*, and solidifies by being dried or UV-irradiated or heated after being applied. Such gaskets are referred to as liquid gaskets. A typical example of a liquid gasket is Formed In Place Gasket (commonly known as FIPG). FIPG is a liquid gasket using a foamed foam. After the two surfaces (sealing surfaces) are brought into close contact with each other across the flowable early FIPG, FIPG is cured by being heated or UV-irradiated or by absorbing moisture in the atmosphere.

The excess FIPG may overflow from the sealing surface because the two sealing surfaces are brought into close contact while FIPG is flowable. In FIG. 2, it is shown that the excess gasket 30*a* extends to the periphery of the bolt hole 12*b* of the fixing base 12*a*.

Although not shown in FIG. 2, excess gaskets may spread out of the first seat surface 12*s* over the entire area of the first seat surface 12*s* surrounding the opening 11. FIG. 3 is a cross-sectional view taken along III-III line of FIG. 1, wherein the excess gasket 30*b*, 30*c* overflowing from the first seat surface 12*s* is depicted in FIG. 3.

As shown in FIG. 3, the second seat surface 13*s* is separated from the first seat surface 12*s* by a groove 15. The excess gasket 30*c* overflowing from between the cover main body 21 and the first seat surface 12*s* falls into the groove 15, and thus does not reach the second seat surface 13*s*.

The housing 10 and the cover 20 are made of a conductive material. If the electric potential of the housing 10 is different from the electric potential of the cover 20, electromagnetic noise generated by electrical components inside the housing 10 may leak out of the casing 2. Alternatively, electromagnetic noise outside the casing 2 may reach the internal electrical components. Therefore, it is desirable that the housing 10 and the cover 20 have the same potential. On the other hand, the gasket 30 is non-conductive. Since the non-conductive gasket 30 is sandwiched between the cover main body 21 and the first seat surface 12*s*, the cover main body 21 and the first seat surface 12*s* (the housing 10) are not in contact with each other. The bolt 40 is in contact with both the housing 10 and the cover 20, and the housing 10 and the cover 20 may be electrically connected through the bolt 40. However, the bolt 40 may be made of a material having a relatively large electrical resistance or coated with a material having a relatively large electrical resistance. In such a case, a potential difference may remain between the housing 10 and the cover 20 through the bolt 40.

On the other hand, as described above, the excess gasket falls into the groove 15 and does not reach the second seat surface 13*s*. Therefore, the positioning tabs 22 are in contact with the second seat surface 13*s* (see FIG. 3). The positioning tab 22 is made of the same conductive material as the cover main body 21. Therefore, the cover 20 is in electrical communication with the housing 10 through the positioning tabs 22 and both are at equipotential. By providing the groove 15 between the first seat surface 12*s* and the second seat surface 13*s*, the housing 10 and the cover 20 are reliably electrically connected to each other.

Further, as shown in FIG. 3, the height H of the second seat surface 13*s* (the height from the lowest position of the housing 10 to the second seat surface 13*s*) is the same as the height of the surface of the gasket 30 (the gasket surface 30*s*). This configuration also contributes to a reliable contacting of the second seat surface 13*s* with the positioning tabs 22 (cover 20). The height H of the second seat surface 13*s* may be equal to or higher than the height of the gasket surface 30*s*. When the height H of the second seat surface 13*s* is higher than the gasket surface 30*s*, the positioning tab 22 is pushed by the pin base 13 to be deformed. The positioning tab 22 securely contacts the second seat surface 13*s*, and the housing 10 and the cover 20 are held securely in electrical communication.

The fact that the height H of the second seat surface 13*s* is equal to or higher than the height of the gasket surface 30*s* is equivalent to the fact that the height of the second seat surface 13*s* is higher than the height of the first seat surface 12*s*.

Points to be noted regarding the technique described in the embodiment will be described. The housing may comprise a plurality of positioning pins (locating pedestal and second seat surface). The cover may comprise a plurality of positioning holes corresponding to each positioning pin. The plurality of positioning pins may be provided on one pin base. Each of the plurality of positioning pins may be provided on each of the plurality of pin bases. When the casing includes a plurality of pin seats, it is sufficient that a groove is provided between the seat surface (second seat surface) of the at least one pin seat and the first seat surface.

The cover may be provided with a hole or connector through which the cable passes.

Although the specific examples of the present disclosure have been described in detail above, these are merely examples and do not limit the scope of claims. The techniques described in the claims include various modifications and alternations of the specific examples illustrated above. The technical elements described in the present specification or the drawings exhibit technical usefulness alone or in various combinations, and are not limited to the combinations described in the claims at the time of filing. In addition, the techniques illustrated in the present specification or drawings can achieve a plurality of objectives at the same time, and achieving one of the objectives itself has technical usefulness.

What is claimed is:

1. A casing of an electrical device, the casing comprising:

a housing that has conductivity and has an opening;

a cover that has conductivity and is configured to close the opening; and a gasket that has non-conductivity, wherein the housing includes a housing surface, a cover base that surrounds the opening and protrudes from the housing surface, the cover base including a first seat surface that is a top surface of the cover base, a pin base disposed adjacent to the cover base and protruding from the housing surface, the pin base including a second seat surface that is a top surface of the pin base, a positioning pin that protrudes from the second seat surface, and a groove that is provided between the cover base and the pin base and separates the second seat surface from the first seat surface, the cover includes a cover main body and a positioning tab that extends outward from an edge of the cover main body, the positioning tab being provided with a positioning hole, the positioning pin is configured to fit into the positioning hole, the gasket is disposed between the first seat surface and the cover main body, the gasket is a liquid gasket that has fluidity before being applied to the first seat surface and hardens after being applied to the first seat surface, the positioning tab is in contact with the second seat surface, and the cover and the housing are electrically conductive via the positioning tab.

2. The casing according to claim 1, wherein a first protruding height of the pin base from the housing surface is equal to or greater than a second protruding height of the cover base from the housing surface.

3. The casing according to claim 1, wherein the opening has a rectangular shape.

4. The casing according to claim 3, wherein the cover base includes a first fixing base and a second fixing base, the first fixing base is provided along one long side of the opening, and the second fixing base is provided along the other long side of the opening.

* * * * *